US007804686B2

(12) United States Patent
Parish et al.

(10) Patent No.: US 7,804,686 B2
(45) Date of Patent: Sep. 28, 2010

(54) THERMAL CONTROL SYSTEM FOR RACK MOUNTING

(75) Inventors: Overton L. Parish, Frisco, TX (US); Niran Balachandran, Lewisville, TX (US); Tony Quisenberry, Highland Village, TX (US); William F. Leggett, Lewisville, TX (US)

(73) Assignee: Thermotek, Inc., Flower Mound, TX (US)

( * ) Notice: Subject to any disclaimer, the term of this patent is extended or adjusted under 35 U.S.C. 154(b) by 0 days.

(21) Appl. No.: 12/176,084

(22) Filed: Jul. 18, 2008

(65) Prior Publication Data

US 2009/0109622 A1    Apr. 30, 2009

Related U.S. Application Data

(63) Continuation of application No. 11/202,885, filed on Aug. 12, 2005, now abandoned.

(60) Provisional application No. 60/601,013, filed on Aug. 12, 2004.

(51) Int. Cl.
*H05K 7/20* (2006.01)
*F28D 15/00* (2006.01)

(52) U.S. Cl. ............... 361/696; 361/695; 361/698; 361/699; 361/701; 165/104.33

(58) Field of Classification Search ......... 361/699–703, 361/695, 696, 698; 165/80.4–80.5, 104.33
See application file for complete search history.

(56) References Cited

U.S. PATENT DOCUMENTS

| | | | |
|---|---|---|---|
| 773,828 A | 11/1904 | Titus et al. |
| 2,110,022 A | 3/1938 | Kliesrath |
| 2,504,308 A | 4/1950 | Donkle, Jr. |
| 3,014,117 A | 12/1961 | Madding |
| 3,345,641 A | 10/1967 | Jennings |
| 3,367,319 A | 2/1968 | Carter, Jr. |
| 3,608,091 A | 9/1971 | Olson et al. |
| 3,660,849 A | 5/1972 | Jonnes et al. |
| 3,736,764 A | 6/1973 | Chambers et al. |
| 3,738,702 A | 6/1973 | Jacobs |
| 3,744,053 A | 7/1973 | Parker et al. |
| 3,862,629 A | 1/1975 | Rotta |

(Continued)

FOREIGN PATENT DOCUMENTS

CH    670 541    6/1989

(Continued)

OTHER PUBLICATIONS

Artikis, T., PCT International Preliminary Report on Patentability as mailed Jul. 29, 2005, (9 pgs.), PCT/US04/023244.

(Continued)

*Primary Examiner*—Jayprakash N Gandhi
*Assistant Examiner*—Robert J Hoffberg
(74) *Attorney, Agent, or Firm*—Winstead PC

(57) ABSTRACT

A thermal control system of a 3U height includes various modules for providing temperature control in a rack environment. The modules may be, for example, a power module, user interface module, various different pump assemblies, various different models of fan assemblies, HTAs, and/or a serial communication interfaces.

10 Claims, 8 Drawing Sheets

U.S. PATENT DOCUMENTS

| | | |
|---|---|---|
| 3,894,213 A | 7/1975 | Agarwala |
| 4,006,604 A | 2/1977 | Seff |
| 4,013,069 A | 3/1977 | Hasty |
| 4,459,822 A | 7/1984 | Pasternack |
| 4,503,484 A | 3/1985 | Moxon |
| 4,547,906 A | 10/1985 | Nishida et al. |
| 4,660,388 A | 4/1987 | Greene, Jr. |
| 4,821,354 A | 4/1989 | Little |
| 4,844,072 A | 7/1989 | French et al. |
| 4,884,304 A | 12/1989 | Elkins |
| 4,901,200 A | 2/1990 | Mazura |
| 4,911,231 A | 3/1990 | Horne et al. |
| 4,962,761 A | 10/1990 | Golden |
| 4,979,375 A | 12/1990 | Nathans et al. |
| 4,996,970 A | 3/1991 | Legare |
| 5,044,364 A | 9/1991 | Crowther |
| 5,067,040 A | 11/1991 | Fallik |
| 5,080,089 A | 1/1992 | Mason et al. |
| 5,092,271 A | 3/1992 | Kleinsasser |
| 5,097,829 A | 3/1992 | Quisenberry |
| 5,106,373 A | 4/1992 | Augustine et al. |
| 5,112,045 A | 5/1992 | Mason et al. |
| 5,125,238 A | 6/1992 | Ragan et al. |
| 5,165,127 A | 11/1992 | Nicholson |
| 5,179,941 A | 1/1993 | Siemssen et al. |
| 5,184,612 A | 2/1993 | Augustine |
| 5,186,698 A | 2/1993 | Mason et al. |
| 5,232,020 A | 8/1993 | Mason et al. |
| 5,241,951 A | 9/1993 | Mason et al. |
| 5,243,706 A | 9/1993 | Frim et al. |
| 5,263,538 A | 11/1993 | Amidieu et al. |
| 5,285,347 A | 2/1994 | Fox et al. |
| D345,082 S | 3/1994 | Wenzl |
| D345,609 S | 3/1994 | Mason et al. |
| D345,802 S | 4/1994 | Mason et al. |
| D345,803 S | 4/1994 | Mason et al. |
| 5,300,101 A | 4/1994 | Augustine et al. |
| 5,300,102 A | 4/1994 | Augustine et al. |
| 5,300,103 A | 4/1994 | Stempel et al. |
| 5,303,716 A | 4/1994 | Mason et al. |
| 5,316,250 A | 5/1994 | Mason et al. |
| D348,106 S | 6/1994 | Mason et al. |
| 5,323,847 A | 6/1994 | Koizumi et al. |
| 5,324,319 A | 6/1994 | Mason et al. |
| 5,324,320 A | 6/1994 | Augustine et al. |
| D348,518 S | 7/1994 | Mason et al. |
| 5,330,519 A | 7/1994 | Mason et al. |
| 5,336,250 A | 8/1994 | Augustine |
| 5,343,579 A | 9/1994 | Dickerhoff et al. |
| 5,350,417 A | 9/1994 | Augustine |
| D351,472 S | 10/1994 | Mason et al. |
| 5,352,174 A | 10/1994 | Mason et al. |
| 5,354,117 A | 10/1994 | Danielson et al. |
| D352,781 S | 11/1994 | Mason et al. |
| 5,360,439 A | 11/1994 | Dickerhoff et al. |
| 5,370,178 A | 12/1994 | Agonafer et al. |
| 5,371,665 A | 12/1994 | Quisenberry et al. |
| 5,402,542 A | 4/1995 | Viard |
| 5,405,370 A | 4/1995 | Irani |
| 5,405,371 A | 4/1995 | Augustine et al. |
| 5,411,494 A | 5/1995 | Rodriguez |
| 5,411,541 A | 5/1995 | Bell et al. |
| 5,417,720 A | 5/1995 | Mason |
| 5,440,450 A | 8/1995 | Lau et al. |
| 5,449,379 A | 9/1995 | Hadtke |
| 5,507,792 A | 4/1996 | Mason |
| 5,509,894 A | 4/1996 | Mason et al. |
| 5,528,485 A | 6/1996 | Devilbiss et al. |
| 5,561,981 A | 10/1996 | Quisenberry et al. |
| 5,566,062 A | 10/1996 | Quisenberry et al. |
| 5,578,022 A | 11/1996 | Scherson et al. |
| 5,588,954 A | 12/1996 | Ribando et al. |
| 5,591,200 A | 1/1997 | Cone et al. |
| 5,648,716 A | 7/1997 | Devilbiss et al. |
| D383,547 S | 9/1997 | Mason et al. |
| D383,848 S | 9/1997 | Mason et al. |
| 5,662,695 A | 9/1997 | Mason et al. |
| 5,672,152 A | 9/1997 | Mason et al. |
| 5,675,473 A | 10/1997 | McDunn et al. |
| 5,682,748 A | 11/1997 | DeVilbiss et al. |
| 5,689,957 A | 11/1997 | DeVilbiss et al. |
| 5,690,849 A | 11/1997 | DeVilbiss et al. |
| 5,711,155 A | 1/1998 | DeVilbiss et al. |
| 5,731,954 A | 3/1998 | Cheon |
| 5,755,755 A | 5/1998 | Panyard |
| 5,772,618 A | 6/1998 | Mason et al. |
| 5,782,780 A | 7/1998 | Mason et al. |
| 5,807,294 A | 9/1998 | Cawley et al. |
| 5,827,208 A | 10/1998 | Mason |
| 5,831,824 A | 11/1998 | McDunn et al. |
| 5,890,371 A | 4/1999 | Rajasubramanian et al. |
| 5,901,037 A | 5/1999 | Hamilton et al. |
| 5,923,533 A | 7/1999 | Olson |
| 5,989,285 A | 11/1999 | DeVilbiss et al. |
| 6,055,157 A | 4/2000 | Bartilson |
| 6,058,010 A | 5/2000 | Schmidt et al. |
| 6,058,712 A | 5/2000 | Rajasubramanian et al. |
| 6,080,120 A | 6/2000 | Sandman et al. |
| D430,288 S | 8/2000 | Mason et al. |
| D430,289 S | 8/2000 | Mason et al. |
| 6,125,036 A | 9/2000 | Kang et al. |
| 6,176,869 B1 | 1/2001 | Mason et al. |
| 6,260,890 B1 | 7/2001 | Mason |
| 6,270,481 B1 | 8/2001 | Mason et al. |
| 6,295,819 B1 | 10/2001 | Mathiprakasam et al. |
| 6,305,180 B1 | 10/2001 | Miller et al. |
| 6,319,114 B1 | 11/2001 | Nair et al. |
| 6,462,949 B1 | 10/2002 | Parish, IV et al. |
| 6,551,264 B1 | 4/2003 | Cawley et al. |
| 6,596,016 B1 | 7/2003 | Vreman |
| 6,667,883 B1 | 12/2003 | Solis et al. |
| 6,675,072 B1 | 1/2004 | Kerem |
| D486,870 S | 2/2004 | Mason |
| 6,695,823 B1 | 2/2004 | Lina et al. |
| 6,719,713 B2 | 4/2004 | Mason |
| 6,719,728 B2 | 4/2004 | Mason et al. |
| 6,775,137 B2 | 8/2004 | Chu et al. |
| 6,789,024 B1 | 9/2004 | Kochan, Jr. et al. |
| 6,802,823 B2 | 10/2004 | Mason |
| 6,834,712 B2 | 12/2004 | Parish et al. |
| 6,848,498 B2 | 2/2005 | Seki et al. |
| 6,855,158 B2 | 2/2005 | Stolpmann |
| 6,893,414 B2 | 5/2005 | Goble et al. |
| 6,935,409 B1 | 8/2005 | Parish IV et al. |
| 6,936,019 B2 | 8/2005 | Mason |
| 7,066,949 B2 | 6/2006 | Gammons et al. |
| 7,081,128 B2 | 7/2006 | Hart et al. |
| 7,306,568 B2 | 12/2007 | Diana |
| 7,484,552 B2 * | 2/2009 | Pfahnl ............... 165/80.4 |
| 2001/0039439 A1 | 11/2001 | Elkins et al. |
| 2003/0089486 A1 | 5/2003 | Parish et al. |
| 2003/0089487 A1 | 5/2003 | Parish, IV et al. |
| 2003/0127215 A1 | 7/2003 | Parish, IV et al. |
| 2004/0008483 A1 | 1/2004 | Cheon |
| 2004/0030281 A1 | 2/2004 | Goble et al. |
| 2004/0046108 A1 | 3/2004 | Spector |
| 2004/0054307 A1 | 3/2004 | Mason et al. |
| 2004/0068309 A1 | 4/2004 | Edelman |
| 2004/0099407 A1 | 5/2004 | Parish, IV et al. |
| 2004/0193218 A1 | 9/2004 | Butler |
| 2004/0221604 A1 | 11/2004 | Ota et al. |
| 2004/0260231 A1 | 12/2004 | Goble et al. |
| 2005/0006061 A1 | 1/2005 | Quisenberry et al. |
| 2005/0039887 A1 | 2/2005 | Parish et al. |

| | | | |
|---|---|---|---|
| 2005/0133214 A1 | 6/2005 | Pfahnl | |
| 2005/0143797 A1 | 6/2005 | Parish et al. | |
| 2005/0256556 A1 | 11/2005 | Schirrmacher et al. | |
| 2005/0274120 A1 | 12/2005 | Quisenberry et al. | |
| 2005/0284615 A1 | 12/2005 | Parish et al. | |
| 2006/0034053 A1 | 2/2006 | Parish et al. | |
| 2006/0058714 A1 | 3/2006 | Rhoades | |
| 2007/0112401 A1 | 5/2007 | Balachandran et al. | |
| 2007/0282249 A1 | 12/2007 | Quisenberry | |
| 2008/0058911 A1* | 3/2008 | Parish et al. | 607/104 |
| 2008/0071330 A1 | 3/2008 | Quisenberry | |
| 2009/0069731 A1* | 3/2009 | Parish et al. | 601/150 |

FOREIGN PATENT DOCUMENTS

| | | |
|---|---|---|
| DE | 35 22 127 | 1/1987 |
| EP | 0 489 326 | 6/1992 |
| SU | 689674 | 10/1979 |
| WO | WO-93/09727 | 5/1993 |
| WO | WO-00/40186 | 7/2000 |

OTHER PUBLICATIONS

Tom Lee, T.Y. et al; "Compact Liquid Cooling System for Small, Moveable Electronic Equipment", IEEE Transactions on Components, Hybrids, and Manufacturing Technology, Oct. 15, 1992, No. 5, pp. 786-793.

Cyro/Temp Therapy Systems; Product News Catalogue; Jobst Institute, Inc., 6 pages.

Copenheaver, Blaine R., International Search Report for PCT/US2007/022148 as mailed Apr. 2, 2008, 2 pages.

* cited by examiner

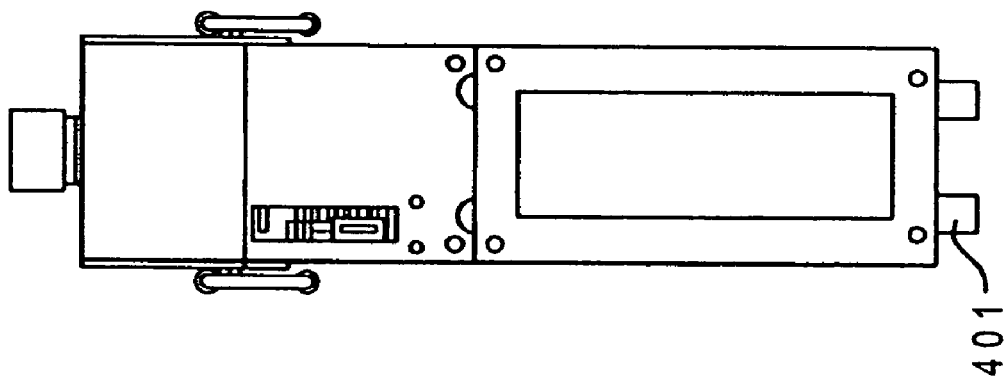
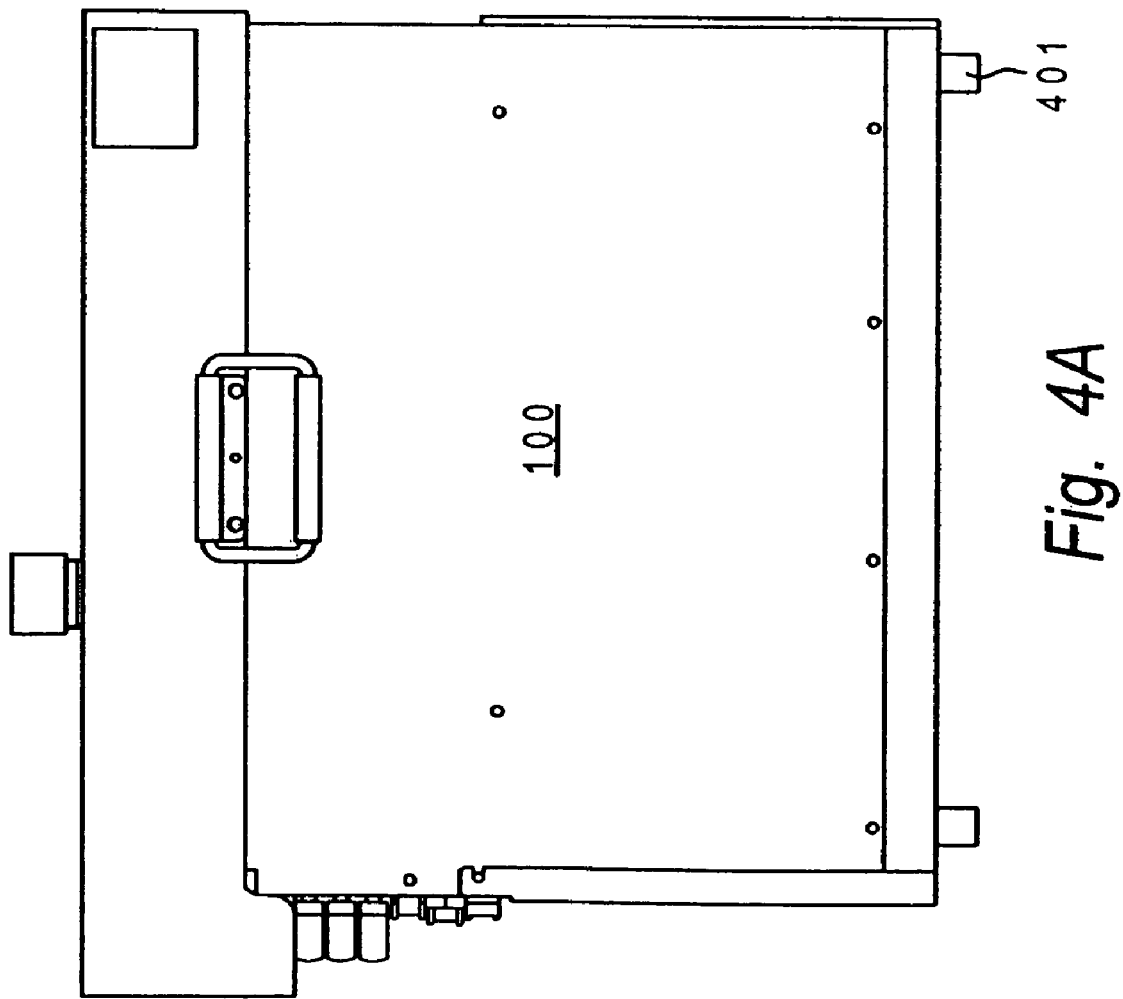
Fig. 4B
Fig. 4A

Figure 8

| SPECIFICATION: | | | | | | |
|---|---|---|---|---|---|---|
| 1. Heat Load (Watts): | 0 | 100 | 200 | 500 | 1000 | Other: _____ |
| 2. Process Medium: | ☐ 15% Glycol / 85% H₂O<br>☐ 15% Isopropyl Alcohol / 85% H₂O<br>☐ Distilled H₂O<br>☐ De-Ionized H₂O | | | | | |
| 3. Process Set Temperature (°C): | -10 | 0 | 10 | 15 | 20 | Other: _____ |
| 4. Process Desired Flow (L): | 0.5 | 1 | 2 | 3 | 4 | Other: _____ |
| 5. Estimated ΔP at Desired Flow (bar): | 0.1 | .25 | 1 | 2 | 4 | Other: _____ |
| 6. Total Hose Length (m): | 0.5 | 1 | 2 | 4 | 8 | Other: _____ |
| 7. Hose Inside Diameter (mm): | 3 | 4 | 5 | 6 | 8 | Other: _____ |
| 8. Hose Insulation | ☐ Yes [STD] | | | ☐ None | | |
| 9. Hose Insulation Thickness (mm): | 3 | 4 | 5 | 6 | 8 | Other: _____ |
| 10. External Process Filter: | ☐ None [STD] | | | ☐ External 25 μm Filter | | |
| 11. Process Temperature Sensor: | ☐ Internal [STD] | | | ☐ External Sensor | | |
| 12. Process Flow Measurement: | ☐ None [STD] | | | ☐ Flow Sensor | | |
| 13. Process Conductivity Measurement: | ☐ None [STD] | | | ☐ DI Sensor | | |
| 14. Cooling Medium: | ☐ Ambient Air [STD] | | | ☐ Plant Water | | |
| 15. Design Ambient Temperature (°C): | 10 | 15 | 20 | 25 | 30 | Other: _____ |
| 16. Cooling Medium Temperature (°C): | N/A | 10 | 15 | 20 | 25 | Other: _____ |
| 17. Air Flow Configuration: | ☐ Front to Back [STD] | | | ☐ Side to Back | | |
| 18. Air Filter: | ☐ Included [STD] | | | ☐ None | | |
| 19. Input Voltage: | ☐ 110 VAC<br>☐ 220 VAC / 60 Hz<br>☐ 220 VAC / 50 Hz<br>☐ Universal Input | | | | | |
| 20. Thermal Cycle Capability: | ☐ 4,000 Cycles [STD] | | | ☐ 40,000 Cycles | | |
| 21. Interface: | ☐ RS-232 [STD]<br>☐ RS-485<br>☐ Ethernet | | | | | |
| 22. Coolant Pump Configuration: | ☐ Centrifugal, 0.75 Bar, 3.0 LPM, 25K hours MTBF [STD]<br>☐ Positive Displacement, 4 Bar, 4.0 LPM, 10Khours MTBF<br>☐ Customer Supplied External Pump | | | | | |
| 23. Fan Configuration: | ☐ Standard Fan [Low dB] | | | ☐ High Performance Fan | | |
| 24. External Fan Tray: | ☐ None [STD] | | | ☐ Fan Tray Module | | |
| 25. Rack Depth | ☐ 588 mm [23" STD] | | | ☐ 381 mm [15"] | | |

ThermoTek, Inc • 1454 Halsey Way Carrollton, Texas 75077 • Tel: 972.242.3232 • Fax: 972.446.1195 • www.thermotekusa.com

THERMAL CONTROL SYSTEM FOR RACK MOUNTING

CROSS-REFERENCE TO RELATED APPLICATIONS

This patent application is a continuation of and incorporates by reference the entire disclosure of U.S. patent application Ser. No. 11/202,885, filed on Aug. 12, 2005 now abandoned. U.S. patent application Ser. No. 11/202,885 claims priority to U.S. Provisional Patent Application No. 60/601,013, filed Aug. 12, 2004, and incorporates by reference for all purposes the entire disclosures of U.S. patent application Ser. No. 09/328,183, now U.S. Pat. No. 6,935,409 filed Jun. 8, 1999 and U.S. Pat. No. 6,462,949, entitled "Electronic Enclosure Cooling System." This patent application incorporates by reference each of U.S. Provisional Patent Application No. 60/601,013, U.S. patent application Ser. No. 09/328,183, and U.S. Pat. No. 6,462,949.

BACKGROUND

1. Technical Field

The present invention relates to thermal control systems, and more particularly, but not by way of limitation, to low profile, rack mounted thermal control systems for cooling or heating equipment disposed in or in the vicinity of an equipment rack.

2. Background of Related Art

As the evolution of computers continued from mini-computers that filled entire rooms with equipment to PC modules similar to the personal computer known today, rack mounted equipment decreased in popularity. However, with the introduction of new electronic equipment, such as slice servers and laser systems, racks are returning to the computing environment. Rack mount enclosures are compact in design and allow for mounting of various components (e.g., servers, laser systems, chillers, etc.) in a stacked style configuration. Utilizing racks allows a user to include various rack mounted components in the rack, decreasing the foot print, while the components remain easily accessible for maintenance.

By mounting multiple components in a rack heat is increased, thereby causing deterioration and possible failure of many of the components. For example, most laser systems, such as those utilized for medical or industrial applications, generate a large amount of heat that requires cooling, via a chiller, in order to maintain proper function. In addition, many components, such as laser systems, perform poorly when subject to vibration and noise that many compressor-based chillers exhibit.

Conventional racks for the components as described herein are typically constructed of predetermined spatial parameters. For example, the height of an individual rack area, or "mounting space" adapted for conventional electronic components and the like is referred to in multiples of "U". Each "U" (standing for the word "unit") is equal to 1.75 inches. A 3U height is therefore 5.25 inches. It is this "U" height that defines the standard rack mounting spatial relationship relative to a typical "19" inch wide mounting space. The "19" inch reference refers in actuality to the space allotted outside the mounting spaces for the equipment or component face plate. The inside of the mounting space generally has an inside dimension on the order of 17.5 inches. Using these spacing parameters, components and equipment mounted within such a rack are typically of a height that is a "U" multiple with a face panel on the order of 19 inches wide.

Although many components, such as servers and laser systems, are available in a height that is on the order of a "U" multiple for placement in the conventional rack, rack mounted chillers typically require a height of more than 3U to offer effective cooling to the surrounding components. Some compressor-based units may require as much as an 8U height. It should be noted, however, that such height is critical to space considerations of the overall rack. Conventional equipment racks only have a specified number of U's available and the higher the number of U's required for temperature control equipment, the fewer U's available for the necessary equipment. It is for this reason that special height considerations are important along with the functionality of the temperature control system.

Today's cooling technology typically includes passive cooling systems, compressor-based systems, and thermoelectric systems. In certain passive cooling systems, the air to be cooled is circulated over an air-to-air heat exchanger, which includes folded, finned heat exchangers, heat pipes, etc. The heat is then exchanged with the outside ambient air. As the amount of heat to be removed from the area increases, the size of the air-to-air heat exchanger increases. Compressor-based systems function by using a refrigerant and the cooling function is achieved by the compression and expansion of the refrigerant such as European Patent Application 1488040A2, entitled "Liquid Cooling System for a Rack-mount Server System," which is hereby incorporated by reference. These compressor-based systems typically weigh over seventy pounds and create unwanted vibrations. Thermoelectric temperature control systems use thermoelectric devices that pump heat using the Peltier effect. Typical thermoelectric devices incorporate a thermoelectric component that utilizes electrical current to absorb heat from one side of the component and dissipate that heat on the opposite side.

In addition to the above, instances arise where heating and/or temperature stabilization is equally important. For example, laser systems require a stable heat and temperature environment because the frequency of the light is dependent on the temperature of the diode. When rack-mounted systems that are vibrationally sensitive require precise temperature control, a compressor based system cannot be used. Thus, a more technologically complex scenario can evolve. A simple chiller is generally not capable of also performing a heating function without adding resistive elements. Thermal electric temperature control systems using thermal electric devices are, as described above, capable of both heating and cooling, low vibration, relatively high Coefficient Of Performance ("COP's") (ability to remove heat), low noise, and low profile.

U.S. patent application Ser. No. 09/328,183 (the '183 patent application), now U.S. Pat. No. 6,935,409, assigned to the assignee of the present invention teaches a heating and cooling system with low vibration, relative high COP's, low noise and low profile. The low profile cooling system of the '183 patent application is, as stated therein, particularly well suited for cooling power amplifiers and other electronic components. In one embodiment, a heat transfer fluid is circulated in a closed loop to the area of components that generate heat. This approach allows the design, implementation and utilization of such thermoelectric cooling systems utilizing low profile extrusions capable of cooling high watt density sub assemblies such as a power amplifiers and filters commonly secured in rack mounted equipment or equipment that may be mounted around a conventional electronic component rack.

It would therefore be a distinct advantage relative to the above-described technology to provide a thermal control system that would be of low vibration, high efficiency, and yet easily mountable within a conventional rack with minimal "U" utilization.

SUMMARY

The present invention relates to thermal control systems for equipment. More particularly, one aspect of the invention relates to low profile, rack-mounted temperature control systems for cooling or heating equipment disposed in or in the vicinity of an equipment rack. The control system is constructed in a 3U (3×1.75"=5.25 inches) height for placement in standard "19" inch wide equipment rack units (inside dimension of unit is in the order of 17½ inches.

In another aspect, the present invention relates to a thermal control system including at least one Heat Transfer Assembly (HTA) module. The HTA modules are formed of low profile extrusions having micro channels formed therein. The HTA's may include external fins and/or high density bonded fin heat sinks.

In another aspect, one embodiment of the invention includes a thermal control system for heating and cooling select equipment disposed in the vicinity of conventional 19 inch equipment racks having an interval mounting space width on the order of 17.5 inches for the placement of equipment therein, and a height on the order of 3U. The system further includes at least one heat transfer assembly module of the type formed with a plurality of low profile extrusions having micro channels formed therein and disposed within a chassis for the flow of heat transfer fluid for thermal control and a height no more than 3U.

In another aspect, the above-described embodiment includes the heat transfer fluid being circulated in a closed loop to cool or heat components within the rack wherein the thermal control system is disposed. In one embodiment, the heat transfer fluid includes a water/glycol mixture, and in another embodiment it includes a water/alcohol mixture.

In yet another embodiment, the above-described invention includes the ability to customize the design of the 3U system and allow on the order of three heat transfer assemblies to effect cooling and/or heating of the temperature control system. A plurality of internal fan assemblies may also be further utilized in conjunction with the heat transfer fluid for the effective transfer of heat therefrom.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 4A is a side-elevation view of the temperature control system with rubber feet attached for standing in a vertical position.

FIG. 4B is a front elevation view of the temperature control system with rubber feet attached for standing in a vertical position.

FIG. 8 is a table detailing various elements that can be selected by the customer to be included in the chassis of the temperature control system of the present invention.

DETAILED DESCRIPTION OF THE ILLUSTRATIVE EMBODIMENTS OF THE INVENTION

Figure 1:
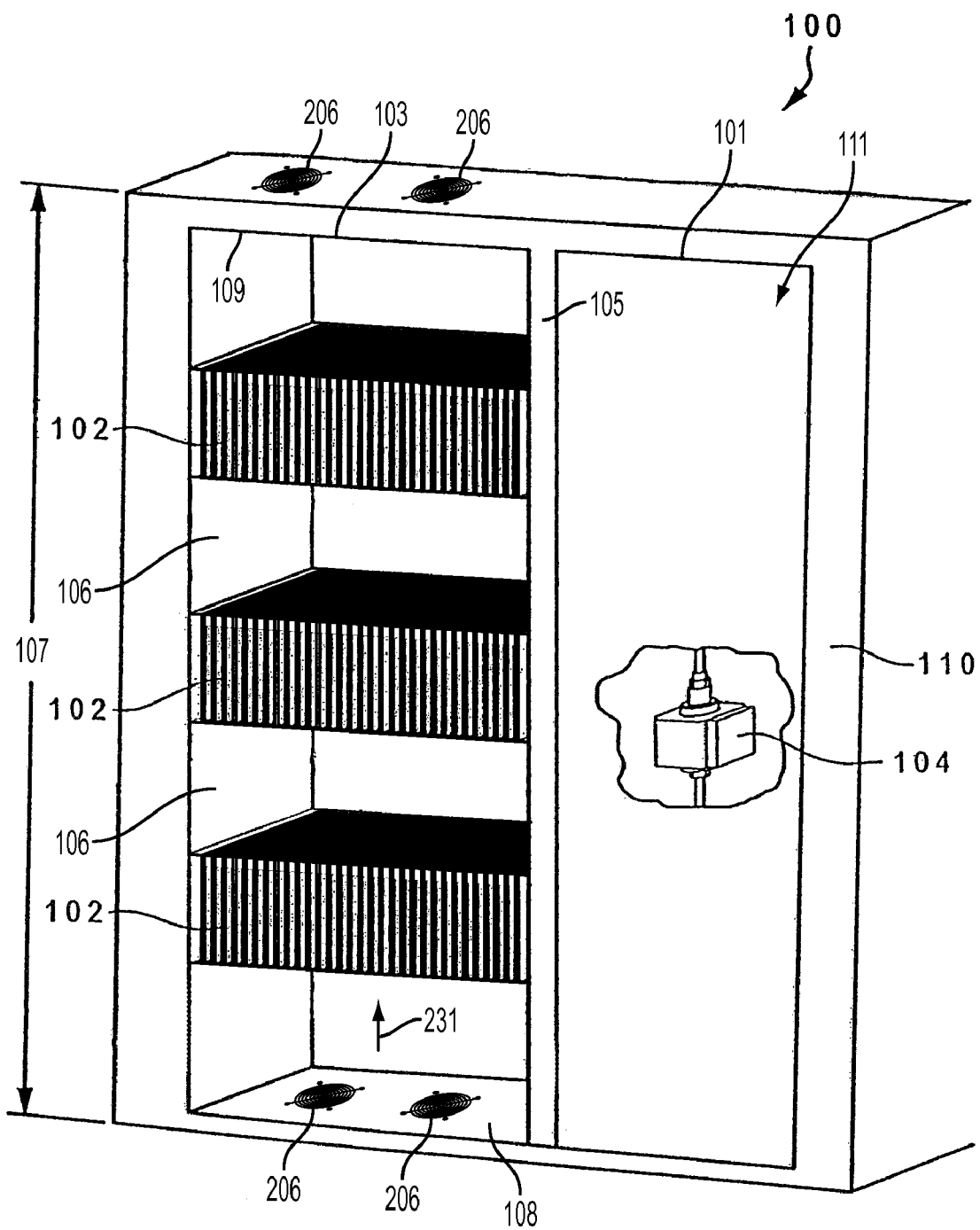
FIG. 1 is a top view of a temperature control system in accordance with an embodiment of the present invention.

Referring now to FIG. 1, a top view of a temperature control system 100 in accordance with an embodiment of the present invention is illustrated. The temperature control system 100 utilizes a heat transfer fluid that is circulated in a closed loop to cool or heat components within a conventional rack. The heat transfer fluid may be, for example, a water/glycol mixture, although other heat transfer fluids may be utilized. In one embodiment, the temperature control system 100 is contained in a chassis 110 having an available internal space 111, a front face 201 and, a rear face 301. In one embodiment, three HTA modules 102 are utilized to effect cooling and/or heating in the temperature control system 100, however embodiments of the present invention may include more or fewer HTA modules as desired. As clearly illustrated in FIG. 1, the HTA modules 102 are secured in a chassis 110 in a continuous heat transfer chassis region 103. Spaces 106 are disposed between adjacent HTA modules 102. The HTA modules 102 are oriented parallel to each other and perpendicular to a depth 107 of the chassis 110. The continuous heat transfer chassis region 103 occupies over half of the available internal space 111 of the chassis 110. The temperature control system 100 may also include up to six internal fan assemblies (not shown) and an addition three internal fans with an external fan tray. The fans may be oriented in a push/pull fan arrangement or other arrangement as desired. In alternate embodiments, fans on the heat transfer side are not included. Instead, the temperature control system 100 may utilize micro extrusions to transfer power from the Thermoelectric Cooling Module ("TEC") via water. The power supplies that drive the TEC's may have variable output (5-135 Vdc) which can be varied by the controller using, for example, a Pulse Width Modulation ("PWM") signal. This variable output design of the power supply can modulate the power to the TEC's to achieve precise temperature control. This variable output also allows the chiller to only use the minimum required input power to provide the optimal control. This lowers the overall input power required by lowering the drive voltage to the TEC's in applications that have low heat loads. A preferred embodiment of the present inventions has thermal performance capabilities of 725 Watts at 0° C. delta T supply minus ambient air. An alternative embodiment of the present inventions utilizing a plant water supply has capabilities in excess of 1,100 Watts at 0° C. delta T supply minus service water.

Figure 7:
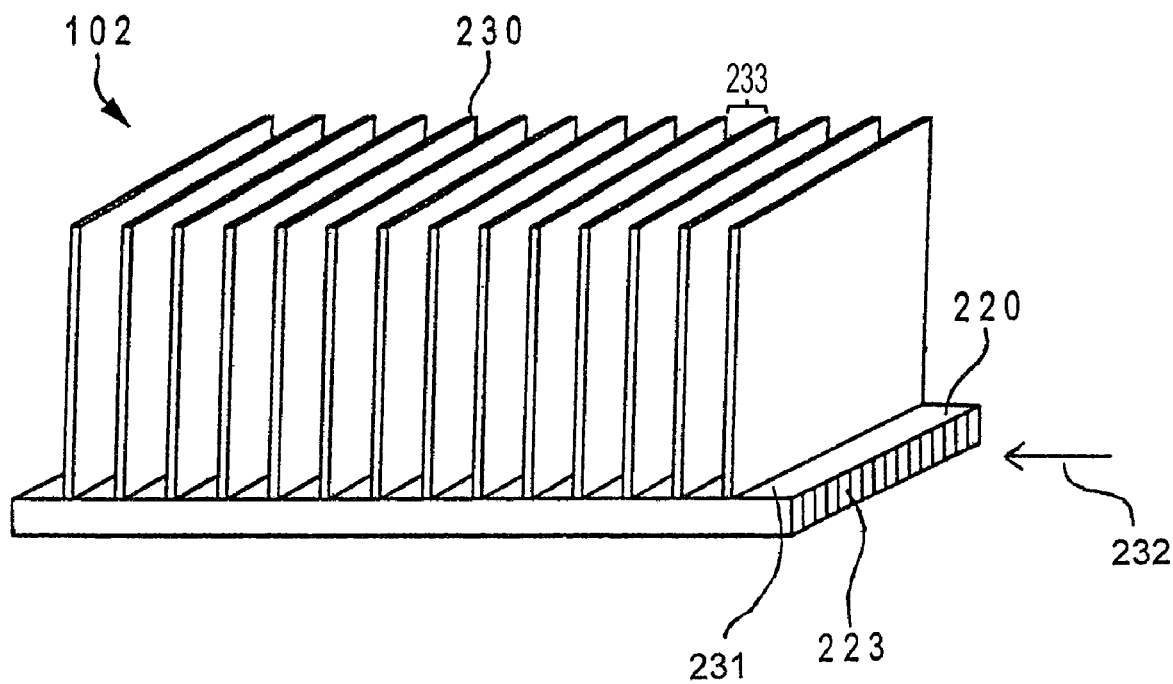
FIG. 7 is a perspective view of an HTA module of the type used in FIG. 1.

The fan assembly 206 maximizes efficiency of the temperature control system 100 by maximizing the airflow (denoted by arrow 231) to the HTA modules 102. In one embodiment, shown in FIG. 7, the HTA modules 102 of the present invention are formed of low profile extrusions 220 having a plurality of micro channels 223. Each micro channel 223 has a micro channel inlet and a micro channel outlet. The low profile extrusions 220 preferably formed with heat sinks 231 and external fins 230 to maximize heat transfer, if space allows. The fins 230 are constructed having spaces 233 disposed there between. In a typical embodiment, the HTA modules are arranged so that the spaces 233 are parallel to a depth 107 of the chassis 110. The micro channel inlets are in fluid communication with each other, and to an inlet channel, by an inlet end cap. Similarly, micro channel outlets are in fluid communication with each other, and to the outlet channel, by an outlet end cap. The heat transfer fluid (denoted by arrow 232) is circulated through the inlet channel, the low profile extrusion 220, the outlet channel, and tubing via the pump 104. As shown in FIG. 1, in a typical embodiment, the heat transfer fluid 232 flows through the low profile extrusion 220 in a direction perpendicular to the depth 107 of the chassis 110. The pump 104 is disposed within the chassis 110 in a continuous pump region 101. The continuous pump region 101 occupies less than half of the available internal space 111 of the chassis 110 and is disposed adjacent to the continuous heat transfer chassis region 103. The continuous pump region 101 and the continuous heat transfer region 103 are separated by a boundary 105. The boundary 105 is disposed parallel to the depth 107 of the chassis 110 and runs between an interior aspect 108 of the front face 201 to an interior aspect 109 of the rear face 301. Alternatively, the temperature control system 100 may be evacuated and charged with fluid which is then circulated via the pump 104. Further details regarding low profile extrusions 220 and the heat transfer fluid flow system and method herein referenced are set forth and shown in U.S. patent application Ser. No. 09/328,183, now U.S. Pat. No. 6,935,409, referenced above and incorporated herein by reference.

The temperature control system 100 utilizes a pump 104, such as a positive displacement, centrifugal, or turbine style magnetically coupled pump. The pump 104 is of such a size as to fit in the 3U configuration and may have a variety of gear sizes, port sizes, etc. as needed. The customized selection of the pump and other components may also be provided in the 3U system as described below. A preferred embodiment of the present invention has flow rate capabilities on the order of one gallon per minute or four Liters per minute.

The temperature control system 100 is formed in a modular design to allow flexibility and versatile configuration for a variety of customers. For example, a customer may request one or two HTAs with a smaller displacement pump in order to create a chiller with less depth, allowing the chassis to only be fifteen inches in depth compared to the standard twenty three inches. In addition, the present invention also may have high thermal cycle module capability. A preferred embodiment of the present invention has the capability of remote temperature monitoring utilizing external temperature sensors such as thermistors or Resistance Temperature Detection ("RTD") devices, etc. A preferred embodiment of the present invention also allows user communication in a variety of manners including serial USB ports, Ethernet ports, RS485 ports and RS232, etc. The present invention has the capability of operation off a DC power source (150-340 Vdc) or universal AC voltage operation (95-250 Vac, 45-70 Hz). There are various wiring selections that can be utilized to maximize the efficiency of the system based on the input voltage. Conductivity meters and voltage sensors may also be utilized to ensure the accuracy of the system. Another preferred embodiment of the present invention utilizes flow meters to monitor air flow across the HTA's and the fluid flow of the heat transfer fluid. The fluid in the present invention can utilize various fluid connections and types depending on the specific needs of the user. One contemplated embodiment utilizes the present invention in conjunction with both external heat exchangers including air and plant liquid coolers. Utilizing the flow meters and conductivity meters in conjunction with the temperature sensors gives the thermal control system the capability of maintaining the temperature of the heat transfer fluid to within +/−0.05 degrees Celsius.

Another aspect of one embodiment of the present invention is the flexibility that the 3U design affords relative to the customer requests referred to above. As seen in FIG. 1, the temperature control system 100 includes a chassis 110 that provides a basic frame for a variety of options that may be utilized therewith pursuant to customer specification while maintaining the 3U height limitation for rack mounting in accordance with the principles of the present invention. In addition to the 3U height limitation, the present invention weighs approximately fifty-four pounds, making it suitable for a variety of applications. FIG. 8 is thus submitted for illustrating the high level of specificity with which a customer may select various elements within the temperature control system 100 and securement to the chassis 110. By utilizing the chart shown in FIG. 8, the manufacturer of the present invention is able to utilize an "assembly line" type of fabrication without the need for multiple redesign and re-engineering to meet the 3U and/or performance criteria. The various elements as set forth in the chart shown in FIG. 8 can be selected and will all fit within the chassis 110 and within the 3U module fitting into a 3U mounting space of the conventional rack, even though the temperature control system 100 has been customized by a given customer.

SPECIFICATION:

| | | | | | | | |
|---|---|---|---|---|---|---|---|
| 1. | Heat Load (Watts): | 0 | 100 | 200 | 500 | 1000 | Other: _____ |
| 2. | Process Medium: | ☐ 15% Glycol / 85% H₂O<br>☐ 15% Isopropyl Alcohol / 85% H₂O<br>☐ Distilled H₂O<br>☐ De-Ionized H₂O | | | | | |
| 3. | Process Set Temperature (°C): | -10 | 0 | 10 | 15 | 20 | Other: _____ |
| 4. | Process Desired Flow (L): | 0.5 | 1 | 2 | 3 | 4 | Other: _____ |
| 5. | Estimated ΔP at Desired Flow (bar): | 0.1 | .25 | 1 | 2 | 4 | Other: _____ |
| 6. | Total Hose Length (m): | 0.5 | 1 | 2 | 4 | 8 | Other: _____ |
| 7. | Hose Inside Diameter (mm): | 3 | 4 | 5 | 6 | 8 | Other: _____ |
| 8. | Hose Insulation | ☐ Yes [STD] | | | | ☐ None | |
| 9. | Hose Insulation Thickness (mm): | 3 | 4 | 5 | 6 | 8 | Other: _____ |
| 10. | External Process Filter: | ☐ None [STD] | | | | ☐ External 25 µm Filter | |
| 11. | Process Temperature Sensor: | ☐ Internal [STD] | | | | ☐ External Sensor | |
| 12. | Process Flow Measurement: | ☐ None [STD] | | | | ☐ Flow Sensor | |
| 13. | Process Conductivity Measurement: | ☐ None [STD] | | | | ☐ DI Sensor | |
| 14. | Cooling Medium: | ☐ Ambient Air [STD] | | | | ☐ Plant Water | |
| 15. | Design Ambient Temperature (°C): | 10 | 15 | 20 | 25 | 30 | Other: _____ |
| 16. | Cooling Medium Temperature (°C): | N/A | 10 | 15 | 20 | 25 | Other: _____ |
| 17. | Air Flow Configuration: | ☐ Front to Back [STD] | | | | ☐ Side to Back | |
| 18. | Air Filter: | ☐ Included [STD] | | | | ☐ None | |
| 19. | Input Voltage: | ☐ 110 VAC<br>☐ 220 VAC / 60 Hz<br>☐ 220 VAC / 50 Hz<br>☐ Universal Input | | | | | |
| 20. | Thermal Cycle Capability: | ☐ 4,000 Cycles [STD] | | | | ☐ 40,000 Cycles | |
| 21. | Interface: | ☐ RS-232 [STD]<br>☐ RS-485<br>☐ Ethernet | | | | | |
| 22. | Coolant Pump Configuration: | ☐ Centrifugal, 0.75 Bar, 3.0 LPM, 25K hours MTBF [STD]<br>☐ Positive Displacement, 4 Bar, 4.0 LPM, 10Khours MTBF<br>☐ Customer Supplied External Pump | | | | | |
| 23. | Fan Configuration: | ☐ Standard Fan [Low dB] | | | | ☐ High Performance Fan | |
| 24. | External Fan Tray: | ☐ None [STD] | | | | ☐ Fan Tray Module | |
| 25. | Rack Depth | ☐ 588 mm [23" STD] | | | | ☐ 381 mm [15"] | |

THERMOTEK, INC · 1454 HALSEY WAY CARROLLTON, TEXAS 75077 · TEL: 972.242.3232 · FAX: 972.446.1195 · WWW.THERMOTEKUSA.COM

Figure 2:
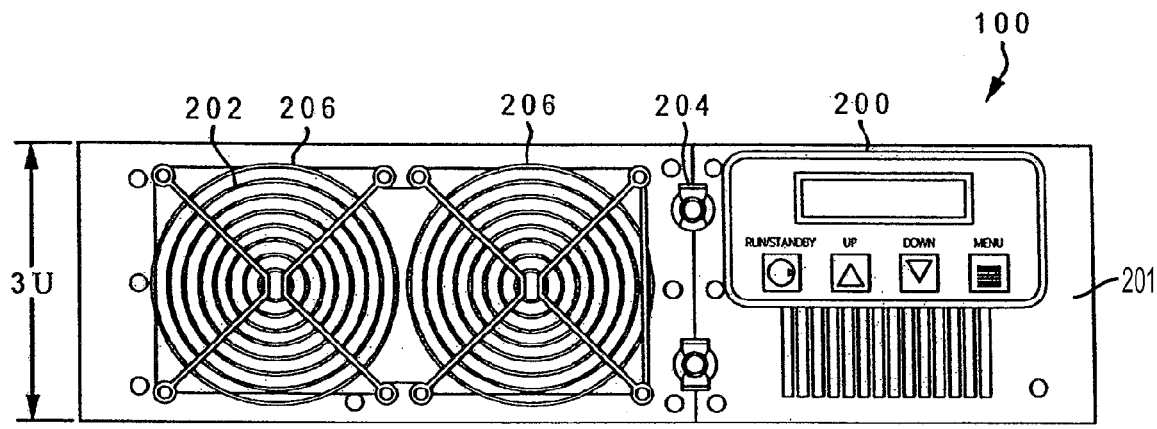
FIG. 2 is a front view of a temperature control system in accordance with an embodiment of the present invention.

Referring now to FIG. 2, a front view of the temperature control system 100 is illustrated. The temperature control system 100 exhibits a front to back air flow and easily removable air filter. The front panel of the temperature control system 100 includes a user interface 200, such as a membrane keypad or other user interface. The user interface 200 allows the user to enter various information (e.g., set various conditions, adjust fan speed, adjust temperature, display flow, heat load, thermal performance, etc.) for use by the temperature control system 100. At least one fan guard 202 protects the fan blades of the fan assemblies 206. The front panel may also include fluid connections 204 including but not limited to quick Connections, National Pipe Taper ("NPT"), etc.

In operation, the 3U system of the present invention affords multiple advantages for both the customer and user. Thermal control systems utilizing a 3U height and manifesting low vibration consistent with the technology set forth and described herein is a distinct advantage. The ability to customize the particular operational system parameters within the temperature control system 100 is likewise of significant benefit. The system 100 can be upgraded as required while manifesting quiet operation, low vibration and being energy efficient even after upgrades. The upgrades are, as referenced above, integral elements that may be selected by the customer and therefore are all compatible with the remaining elements within the 3U system of the present invention.

Figure 3:
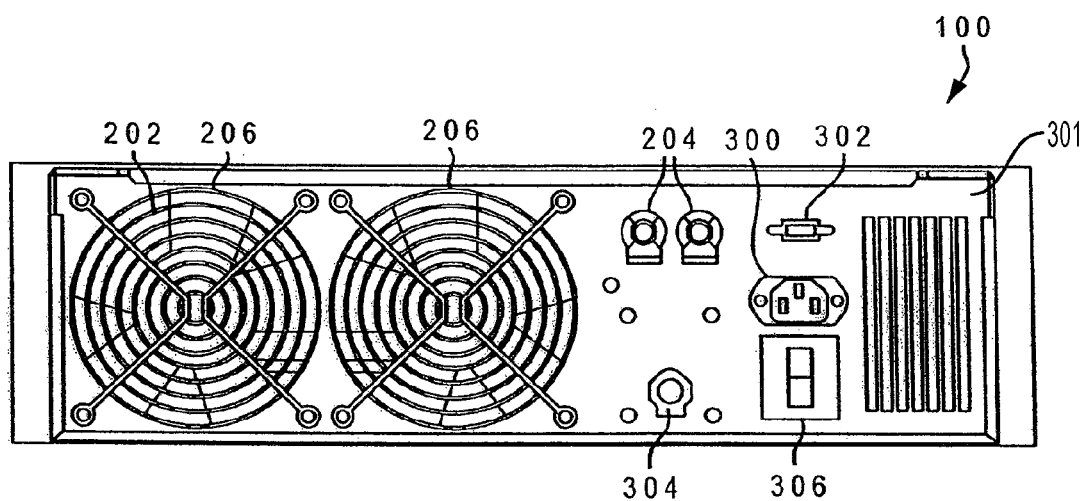
FIG. 3 is a back view of a temperature control system in accordance with an embodiment of the present invention.
Figure 5B:
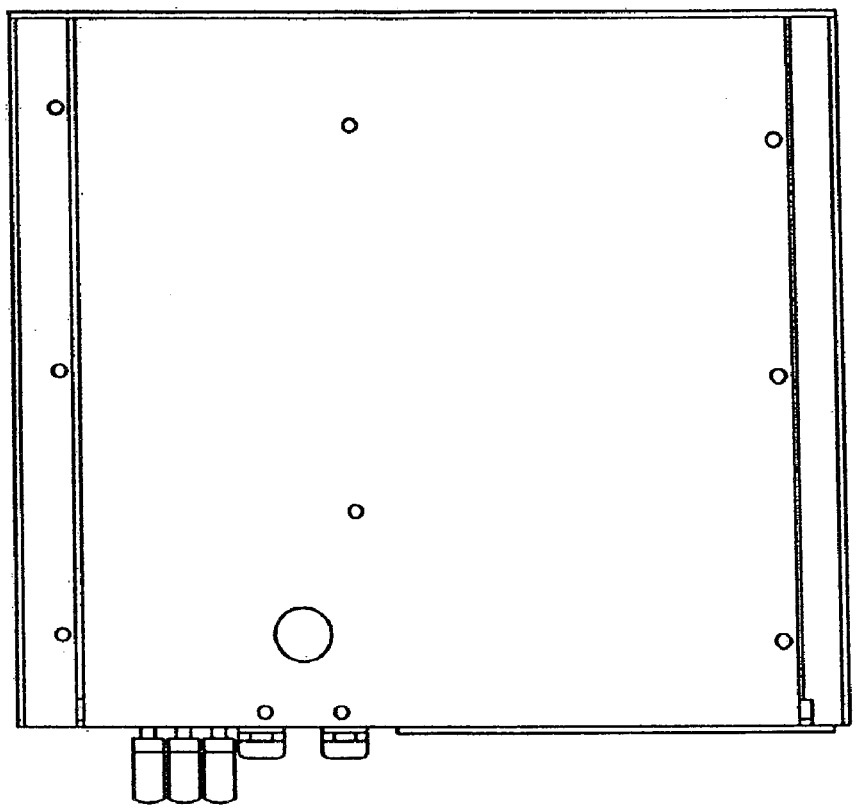
FIG. 5B is a bottom view of the temperature control system with rubber feet attached for standing in a horizontal position.
Figure 5A:
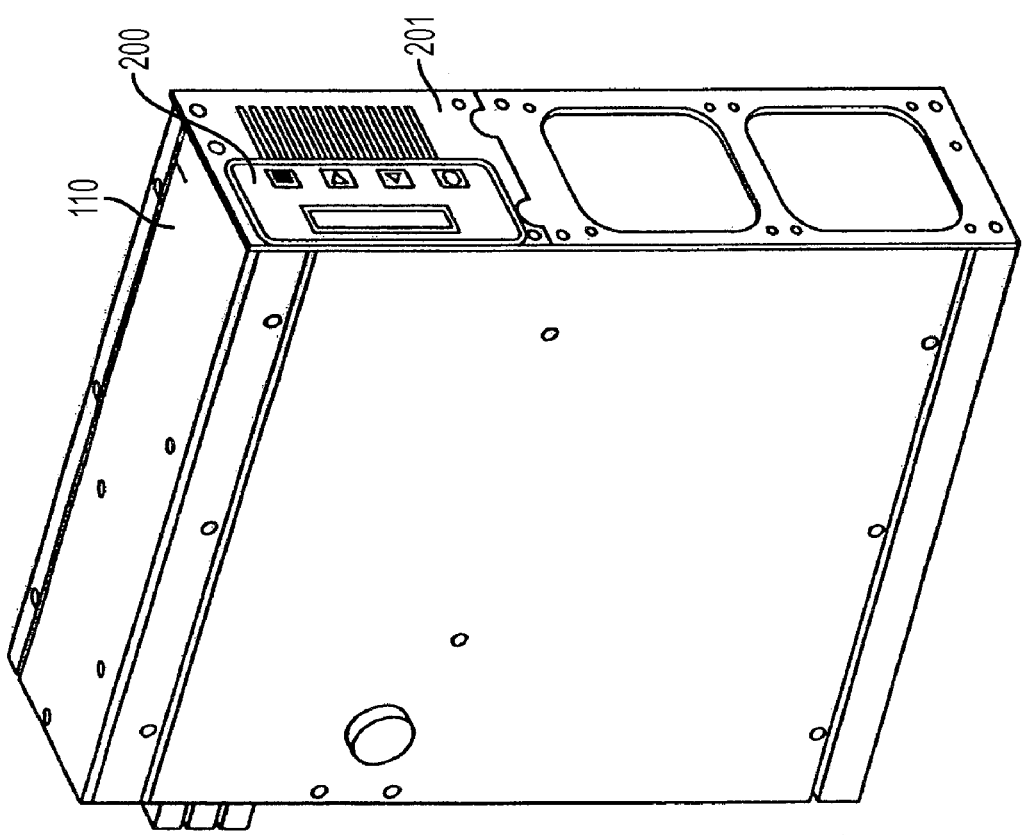
FIG. 5A is a perspective view of the temperature control system with rubber feet attached for standing in a horizontal position.
Figure 5C:
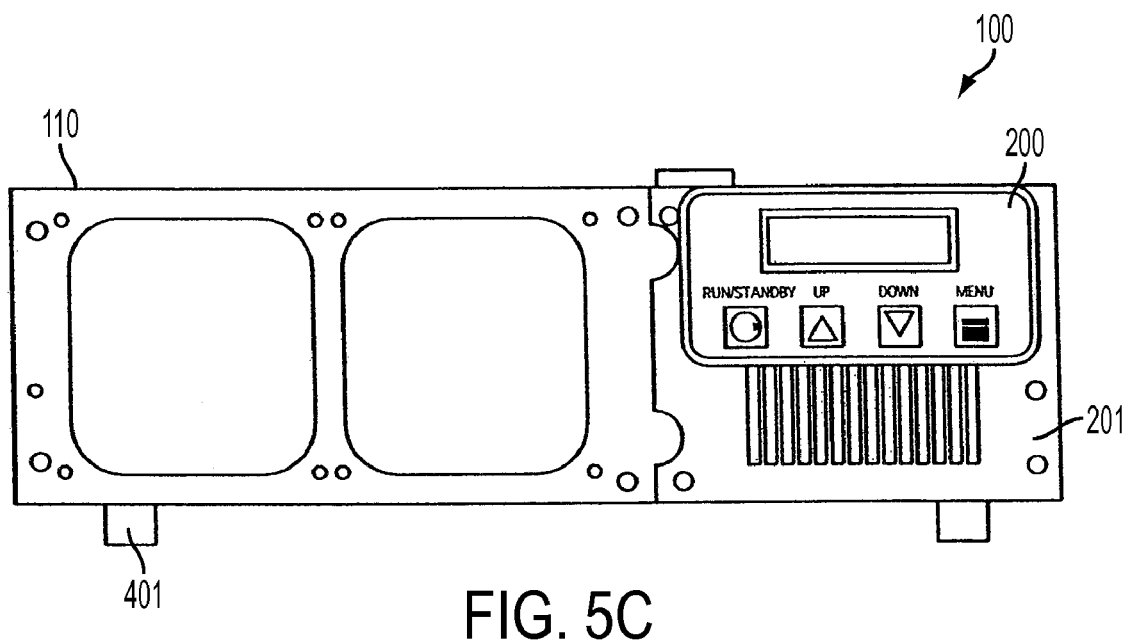
FIG. 5C is a side elevation view of the temperature control system with rubber feet attached for standing in a horizontal position.
Figure 5D:
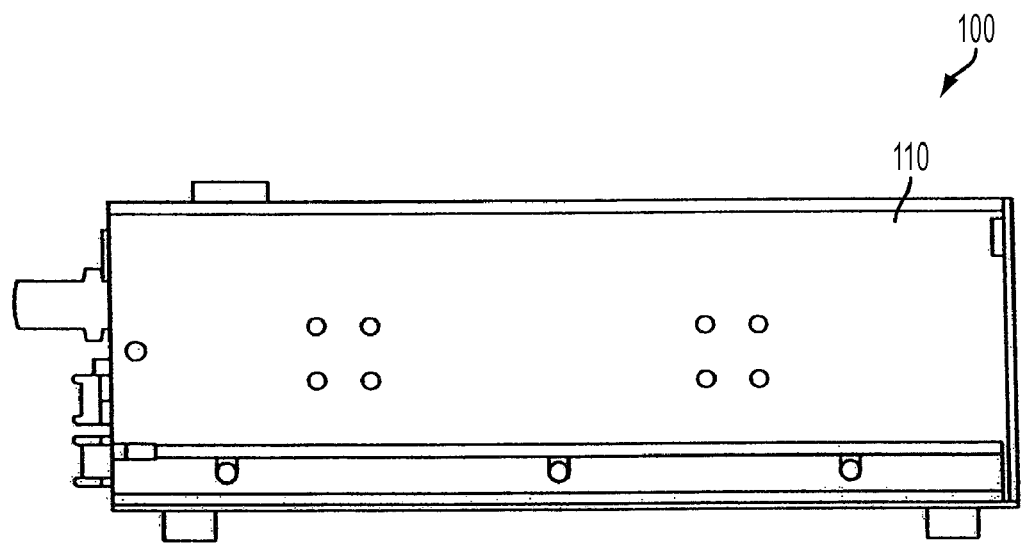
FIG. 5D is a front elevation view of the temperature control system with rubber feet attached for standing in a horizontal position.
Figure 6:
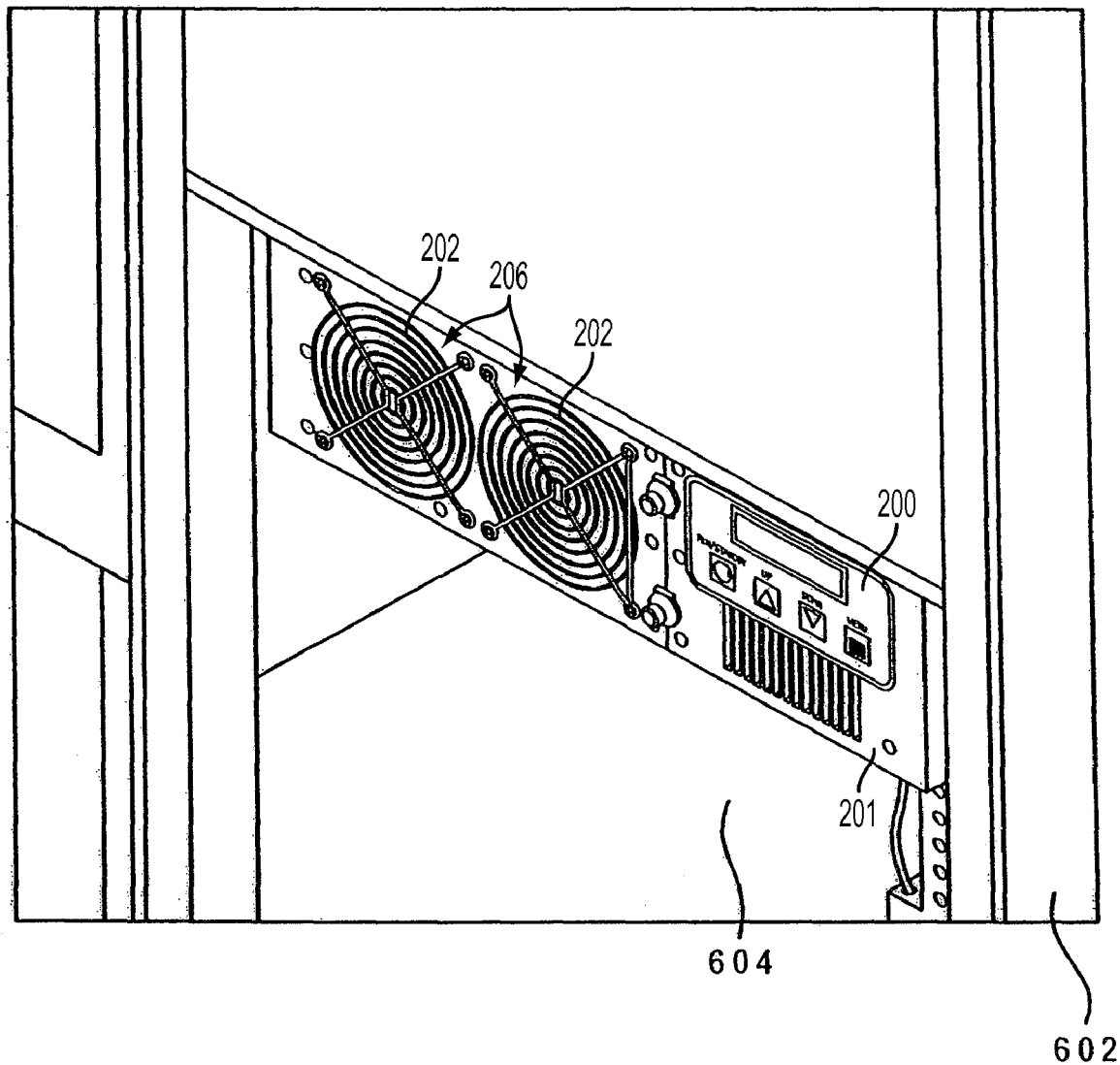
FIG. 6 shows the temperature control system as it would fit into a conventional rack mount.

Referring now to FIG. 3, a rear panel of the temperature control system 100 is illustrated. The rear panel also includes fan guards 202 and fluid connections 204 similar to those of the front panel. Also oriented on the rear panel is a power entry module 300 for supplying power to the thermal control system 100. A reservoir filler quick disconnect 304, communication IP ports including alarms, stand by signals, expansion/accessories, electronics side vents, and an RS232 interface connection 302 are included on the rear panel as well. A circuit breaker 306 prevents the thermal control system 100 from being overloaded by a surge in power.

Referring now to FIGS. 4A and 4B, the thermal control system is shown with the face plate trimmed down and with feet added. This embodiment utilizes the advantages of the slim, low profile design, low vibration, and precise temperature control in a bench top vertical unit. An alternative embodiment of the bench top unit has feet 401 attached in such a way so that the face plate is oriented in the same direction as when mounted in a rack giving a bench top horizontal unit. These configurations keep the unit stable even when not mounted in a conventional rack, allowing it to be used for a plurality of purposes.

Referring now to FIGS. 5A-5D and FIG. 6, the thermal control system is shown disposed in a conventional rack mount 602. The 3U height of the chassis allows it to fit in the slots 604 of the conventional rack mount 602, taking up no more space than most standard electronic equipment. The design of the chassis also allows the thermal control system to be secured to the conventional rack mount 602 in number of different ways, one being with screws through the faceplate.

There are several modifications and variations of the innovative concepts of the present application that are contemplated and within the scope of the patented subject matter. A few examples of these alternative embodiments are given below, but in no way do these examples enumerate all possible contemplated embodiments of the present application.

For example, one contemplated embodiment of the present invention utilizes two temperature control systems for increased cooling capabilities. The present invention has the capability of being connected in a Master/Slave type relationship where both temperature control systems have the capability of being mounted in two separate mounting spaces of a conventional mounting rack.

An example of an alternative embodiment includes mounting the thermal control system independent of the conventional mounting rack. Rubber feet may be added and the system can be placed on a desktop.

Another alternative implementation that is contemplated would be to use the thermal control system disclosed in the present application in conjunction with an external heat exchanger. In this embodiment, the thermal control system would cool the air that passes over the micro channels and at the same time warm the heat transfer fluid. The heat transfer fluid could then be cooled by some external heat exchanger, e.g. plant water. This embodiment may be desirable to use in a closed environment such as a clean room, where the only air exchange possible is through recirculation.

Another example embodiment includes using the thermal control system for the temperature regulation of vehicle parts or compartments in a vehicle.

The previous description is of a preferred embodiment for implementing the invention, and the scope of the invention should not necessarily be limited by this description. The scope of the present invention is instead defined by the following claims.

What is claimed is:

1. A precision thermal control system comprising:
a chassis having an available internal space and a height of no more than 3U, the chassis comprising:
 a front face;
 a rear face;
 a continuous heat transfer chassis region occupying over half of the available internal space of the chassis, the continuous heat transfer chassis region not being coextensive with the available internal space of the chassis, the continuous heat transfer chassis region extending from an interior aspect of the front face to an interior aspect of the rear face; and
 a continuous pump region comprising a pump, the continuous pump region occupying less than half of the available internal space of the chassis, the continuous pump region extending from the interior aspect of the front face to the interior aspect of the rear face, the continuous pump region and the continuous heat transfer region positioned adjacent to each other along a boundary oriented parallel to a depth of the chassis;
a first plurality of fan assemblies disposed adjacent to the front face, the first plurality of fan assemblies connecting the continuous heat transfer chassis region with an exterior environment;
a second plurality of fan assemblies disposed adjacent to the rear face, the second plurality of fan assemblies connecting the continuous heat transfer chassis region with the exterior environment, the first and second plurality of fan assemblies operable to allow an airflow through the continuous heat transfer chassis region;
a user interface disposed on a portion of the front face corresponding to the continuous pump region;
a first plurality of fluid connections disposed on a portion of the front face corresponding to the boundary;
a second plurality of fluid connections disposed on a portion of the rear face corresponding to the boundary;
wherein the continuous heat transfer chassis region comprises:
 a plurality of heat transfer assembly modules secured to the chassis within the heat transfer chassis region, the plurality of heat transfer assembly modules oriented parallel to each other and perpendicular to the depth of the chassis; and a plurality of spaces disposed between each of the heat transfer assembly modules disposed within the heat transfer chassis region, wherein, each of the plurality of heat transfer assembly modules disposed within the heat transfer chassis region comprises:

a low profile extrusion having micro channels formed therein;

a heat transfer fluid disposed within the low profile extrusion; and a plurality of external fins disposed on the low profile extrusion, the plurality of fins having a plurality of gaps therebetween, the plurality of gaps oriented parallel to the depth of the chassis;

wherein the airflow through the continuous heat transfer chassis region is parallel to the depth of the chassis; and wherein the flow of the heat transfer fluid through the low profile extrusion is perpendicular to the depth of the chassis.

2. The system as set forth in claim 1 comprising three heat transfer assembly modules utilized to effect cooling and/or heating in said precision thermal control system.

3. The system as set forth in claim 1 wherein said precision thermal control system is portable.

4. The system as set forth in claim 3 wherein said precision thermal control system further comprises a plurality of support feet adapted to be secured along at least one surface of said chassis for facilitating the placement of said precision thermal control system outside of a conventional equipment rack.

5. The system as set forth in claim 1 wherein said precision thermal control system is programmable.

6. The system as set forth in claim 5 wherein a user sets a range of satisfactory temperatures of said heat transfer fluid and said precision thermal control system automatically adjusts a fan speed and a flow rate of said heat transfer fluid in at least partial dependence on said range of satisfactory temperatures.

7. The system as set forth in claim 5 wherein said precision thermal control system records information the temperature of said heat transfer fluid.

8. The system as set forth in claim 7 wherein the information recorded by said precision thermal control system can be displayed or printed.

9. The system of claim 1 further comprises a variable-output power supply secured within the chassis, wherein an output of the variable-output power supply is varied by a controller via a pulse width modulation signal.

10. The system of claim 1 further comprises a variable-output power supply secured within the chassis, wherein the variable-output power supply allows the precision thermal control system to use a minimum required input power to provide thermal control.

* * * * *

UNITED STATES PATENT AND TRADEMARK OFFICE
CERTIFICATE OF CORRECTION

PATENT NO. : 7,804,686 B2  
APPLICATION NO. : 12/176084  
DATED : September 28, 2010  
INVENTOR(S) : Overton L. Parish et al.

Page 1 of 1

It is certified that error appears in the above-identified patent and that said Letters Patent is hereby corrected as shown below:

Title Page, Item (56)
In the Cited References, Other References
Insert --Young, Lee W., "International Search Report" for PCT/US07/08807 as mailed March 3, 2008, (3 pages).--

Signed and Sealed this
Fifteenth Day of February, 2011

David J. Kappos
*Director of the United States Patent and Trademark Office*